United States Patent [19]
Hayashi et al.

[11] Patent Number: 5,369,301
[45] Date of Patent: Nov. 29, 1994

[54] PIN-FINNED FORGED HEAT SINK

[75] Inventors: Chihiro Hayashi, Takarazuka; Kimihiko Ohminato, Handa, both of Japan

[73] Assignees: Sumitomo Metal Industries, Ltd., Osaka; Sumikin Precision Forge Inc., Handa, both of Japan

[21] Appl. No.: 88,350

[22] Filed: Jul. 9, 1993

[51] Int. Cl.⁵ .......................................... H01L 23/02
[52] U.S. Cl. .................................. 257/722; 257/721; 361/697; 361/702; 361/703; 165/80.3; 165/104.33
[58] Field of Search ................ 257/721, 722; 361/697, 361/702, 703, 709; 165/80.3, 104.33, 185

[56] References Cited

U.S. PATENT DOCUMENTS

| | | | |
|---|---|---|---|
| 3,180,404 | 4/1965 | Nelson et al. | 165/47 |
| 3,961,666 | 6/1976 | Suzuki et al. | 165/129 |
| 4,296,455 | 10/1981 | Leaycraft et al. | 361/691 |
| 4,459,638 | 7/1984 | Brehm et al. | 361/697 |
| 4,694,378 | 9/1987 | Nakayama et al. | 361/700 |
| 4,698,663 | 10/1987 | Sumitomo et al. | 257/713 |
| 4,823,869 | 4/1989 | Arnold et al. | 165/185 |
| 4,879,891 | 11/1989 | Hinshaw | 72/254 |
| 4,884,331 | 12/1989 | Hinshaw | 29/558 |
| 4,884,631 | 12/1989 | Rippel | 165/185 |
| 4,899,210 | 2/1990 | Lorenzetti et al. | 257/712 |
| 5,003,429 | 3/1991 | Baker et al. | 361/704 |
| 5,083,194 | 1/1992 | Bartilson | 257/722 |
| 5,155,579 | 10/1992 | AuYeung | 257/722 |

FOREIGN PATENT DOCUMENTS

| | | |
|---|---|---|
| 0029501A2 | 6/1981 | European Pat. Off. . |
| 0253126 | 1/1988 | European Pat. Off. . |
| 0540420A2 | 5/1993 | European Pat. Off. . |
| 0542478A1 | 5/1993 | European Pat. Off. . |
| 56-198 | 1/1981 | Japan . |
| 61-051931 | 3/1986 | Japan . |
| 61-100361 | 5/1986 | Japan . |
| 2204181 | 11/1988 | United Kingdom . |
| WO-A-91/11024 | 7/1991 | WIPO . |

OTHER PUBLICATIONS

"The Application of Two-Phase Push-Pull Cooling Made in Pin-fin Array Electronic Device", Yu-Lin Chao and Fang-Lin Chao, (Eighth Annual IEEE Semi Conductor Thermal Management Symposium, Feb. 3-5, 1992) pp. 97-100.

Electronics International, S. W. Fields, "Grooved Substrate Boosts IC Cooling"; vol. 55, No. 17, Aug. 1982, pp. 46-48.

*Primary Examiner*—Robert P. Limanek
*Assistant Examiner*—David Ostrowski
*Attorney, Agent, or Firm*—Burns, Doane, Swecker & Mathis

[57] ABSTRACT

Pin-finned heat sink having good heat dissipating characteristics satisfy the following inequality:

$$1.5 \leq \frac{(h/d)}{\{1 + (c/d)\}^2} \leq 7.5$$

where d is the diameter of pins, c is the distance between pins, and h is the height of pins. This heat sink can increase the level of integration of semiconductor devices with which it is used.

6 Claims, 6 Drawing Sheets

PIN-FINNED FORGED HEAT SINK

BACKGROUND OF THE INVENTION

This invention relates to heat sinks having good heat-dissipating properties that are manufactured by cold forging, warm forging, hot forging or combinations of these methods with alkali dissolution. More particularly, it relates to so-called pin-finned heat sinks having pin-shaped cooling fins. The invention also relates to a process for producing pin-finned heat sinks.

Efforts to increase the level of integration in semiconductor devices have progressed so remarkably that devices have emerged today that consume power of 35 watts or more per chip. In order to operate such high-power semiconductor devices with high reliability, the heat generated by the devices must be dissipated to the exterior in an efficient manner. To this end, highly integrated semiconductor devices are fitted with a heat sink having cooling fins.

Heat sinks in common use today are of two types, one having cooling fins of a channel type in which plane parallel plates are arranged in a comb shape, and the other having cooling fins of a tower type in which a plurality of disks are stacked in a tower form. Both types of cooling fins are manufactured by a machining method, so limitations on the thickness of the bite used and difficulties in the processing of cuttings unavoidably increases production costs.

Inexpensive cooling fins of a channel type are produced by hot extrusion, but with this method, the thickness and pitch of the fins are limited to such an extent that only heat sinks having poor dissipating characteristics can be produced.

Many years ago, researchers took an interest in the dissipating characteristics of pin-finned heat sinks, especially their leading edge effects. Subsequently, several reports were published on the manufacture of pin-finned heat sinks by mold casting, machining, or even cold forging. Although a considerable time has since passed, the production of such pin-finned heat sinks has not yet met substantial commercial success on an industrial scale.

Mold casting and machining methods are incapable of producing the desired heat sinks with satisfactory efficiency. On the other hand, with cold forging, it is difficult to assure good cold forming, namely, effective plastic working. Furthermore, whichever method is employed, the heat dissipating characteristics of the resulting pin-finned heat sinks are no better than those of the existing heat sinks in common use today.

SUMMARY OF THE INVENTION

In order to solve the aforementioned problems with the production of pin-finned heat sinks by forging methods, and particularly cold forging methods, and at the same time achieve marked improvements in heat dissipating characteristics of pin-finned heat sinks, the present inventors conducted numerous experiments with varying pin diameters, pin-to-pin distances and pin heights. As a result, the inventors learned that there is a certain correlationship between the shapes of pins and either the heat dissipating characteristics of heat sinks or the difficulty of their manufacture. The inventors also learned that an ideal pin-finned heat sink featuring good economy and high effectiveness can be constructed on the basis of that correlationship.

To construct the ideal pin-finned heat sink, the pin fins to be used must satisfy the following requirements.

(1) During cold forging, the material for the pins should not stuff holes in the molding die, thereby producing pins of uneven height or making the knockout operation difficult to perform or causing the breaking of knockout pins. In addition, no other operational troubles such as cracking in the die should occur (this requirement shall hereunder be referred to as the "difficulty of manufacture").

(2) The pin-finned heat sinks produced by cold forging should have far better dissipating characteristics than conventional channel-finned, tower-finned, and pin-finned heat sinks.

To design pin-finned heat sinks with a 40-mm square shape, the present inventors conducted a cold forging experiment with the following three parameters varied at five levels: pin diameter (d) from 0.5 to 2.5 mm in 0.5-mm increments, pin-to-pin distance (c)(which should not be confused with the pitch of pins) from 0.5 to 2.5 mm in 0.5-mm increments, and pin height (h) from 5 to 25 mm in 5-mm increments. Then, the inventors conducted an experiment in a wind tunnel to determine the heat dissipating characteristics of the fins. As a result, the inventors learned that $\eta$, which is an index of the increment of the area of heat transfer and which is defined by the following equation, $$\eta = \frac{(h/d)}{\{1 + (c/d)\}^2}$$

provides a key for estimating not only the heat transfer characteristics but also the pressure drop characteristics of the pins as well as for evaluating the difficulty of manufacture.

The cooling pins of the present invention may be formed either by a forging method alone or by the combination of forging and subsequent alkali etching. The heat sink produced by forging will be referred to as a "forged heat sink", whereas the one produced by a combination of forging and subsequent alkali etching will be referred to as a "forge-etched heat sink". Forging may be cold forging, warm forging or hot forging.

DETAILED DESCRIPTION OF THE PREFERRED EMBODIMENTS

The significance of each of the parameters in the equation for $\eta$ is described below.

Figure 1:
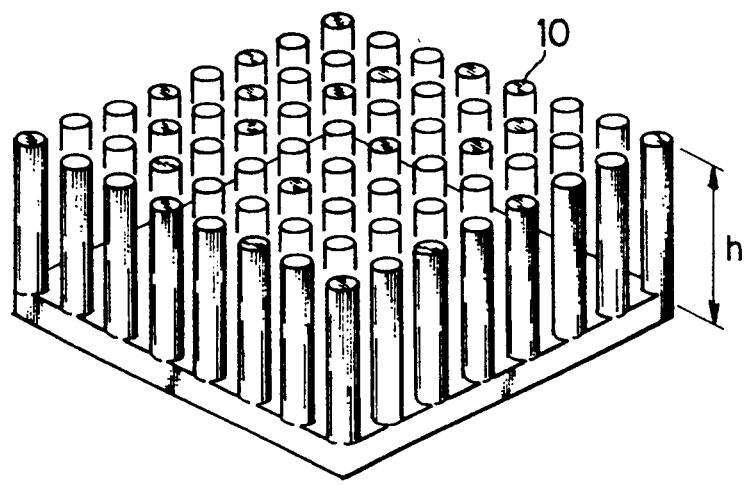
FIG. 1(a) is a schematic perspective view of a pin-finned heat sink of the present invention.
FIG. 1(b) is a diagram showing how the pin-to-pin distance (c) is calculated in the case where pins are arranged in a rectangular pattern.
FIG. 1(c) is a diagram showing how the pin-to-pin distance (c) is calculated in the case where pins are arranged in a staggered pattern.
Figure 1:
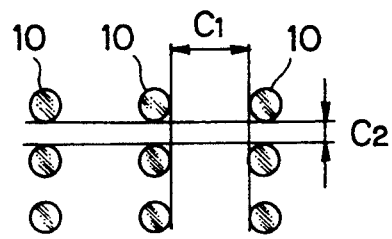
Figure 1:
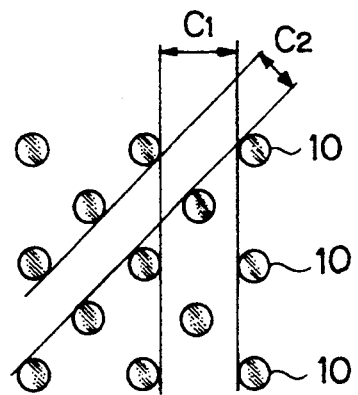

FIG. 1(a) shows a perspective view of a pin-finned heat sink of the present invention.

If the pin height (h) is unduly great compared to the pin diameter (d), thus making the value of index $\eta$ excessive, holes in the die will be choked to make the knockout operation difficult or produce pins of uneven height or sometimes cause the breaking of knockout pins.

If the pin-to-pin distance (c) is unduly small compared to the pin diameter (d), again making the value of index $\eta$ excessive, cracks will develop between holes in the die, eventually leading to the breakage of the die itself. Furthermore, an experiment in a wind tunnel showed that an increased pressure drop occurred in the heat sink under test to deteriorate rather than improve its heat dissipating characteristics, especially when the output of a cooling fan is relatively small.

If, on the other hand, the pin height (h) is unduly small compared to the pin diameter (d) or if the pin-to-pin distance (c) is unduly great compared to the pin diameter (d), the value of $\eta$ becomes unduly small and the area of heat transfer that is achieved is insufficient to assure the desired heat dissipating characteristics.

Therefore, to insure that cooling fins having much better dissipating characteristics than existing fins of a channel type or a tower type or even a pin type can be produced on an industrial scale without any operational troubles, the index $\eta$ must satisfy the following inequality:

$$1.5 \leq \eta \leq 7.5$$

Preferably, $\eta$ satisfies the following inequality:

$$2.5 \leq \eta \leq 6.5$$

More preferably, the following inequality is satisfied:

$$3.5 \leq \eta \leq 5.5$$

As already mentioned, $\eta$ is an index for the increment of the area of heat transfer, but it also represents the pressure drop characteristics as well as the difficulty (or ease) of plastic working.

It is interesting to note here that conventional pin-finned heat sinks produced by cold forging have $\eta$ values ranging from about 0.2 up to about 1.0. With $\eta$ values of this range, the area of heat transfer is insufficient to assure satisfactory heat dissipating characteristics and the actual performance of the heat sink will be inferior to that of a conventional channel- or tower-finned heat sink.

Thus, in general terms, the pin fins to be produced in accordance with the present invention are such that comparatively fine pins of the greatest possible length are arranged closely enough to assure optimal heat dissipating characteristics. In accordance with the present invention, pin finned-heat sinks that are satisfactory in terms of both difficulty of manufacture and heat dissipating characteristics can be produced. Hence, the present invention is of great practical value.

A word must be said here about the pin-to-pin distance (c) which is one of the factors that determine the value of index $\eta$. As FIG. 1(a) shows, pins having a round cross-section may be arranged in a rectangular pattern with the pitch of pins being different in longitudinal and transverse directions. In this case, the distance $c_1$ between pins 10 in two columns and the distance $c_2$ between pins in two rows are averaged to calculate the pin-to-pin distance (c) as follows:

$$c = \tfrac{1}{2}(c_1 + c_2)$$

The pins 10 may be arranged in a different fashion but the pin-to-pin distance (c) can still be calculated on the basis of $c_1$ being the distance between adjacent pins in a first row of pins and $c_2$ being the distance between adjacent pins in a second row of pins which intersects the first row of pins, as shown in FIGS. 1b–c wherein $c_1$ is the distance between adjacent pins of one row and $c_2$ is the distance between one of the pins of the first row and an adjacent pin in a second row which intersects the first row. As FIG. 1(b) shows, they may be arranged in a staggered pattern with the pitch of pins being different for reference (first) rows and pseudo-reference (second) rows that are inclined with respect to the reference (first) rows. In this case, the distance $c_1$ between pins in reference (first) rows and the distance $c_2$ between pins in pseudo-reference (second) rows are averaged to calculate the pin-to-pin distance (c) as follows:

$$c = \tfrac{1}{2}(c_1 + c_2)$$

Next, the important aspects of a cold forging technique that enables the forming of closely arranged fine pin fins while insuring that the index ($\eta$) for evaluating the heat dissipation characteristics is equal to or greater than 1.5 will be described.

Figure 2:
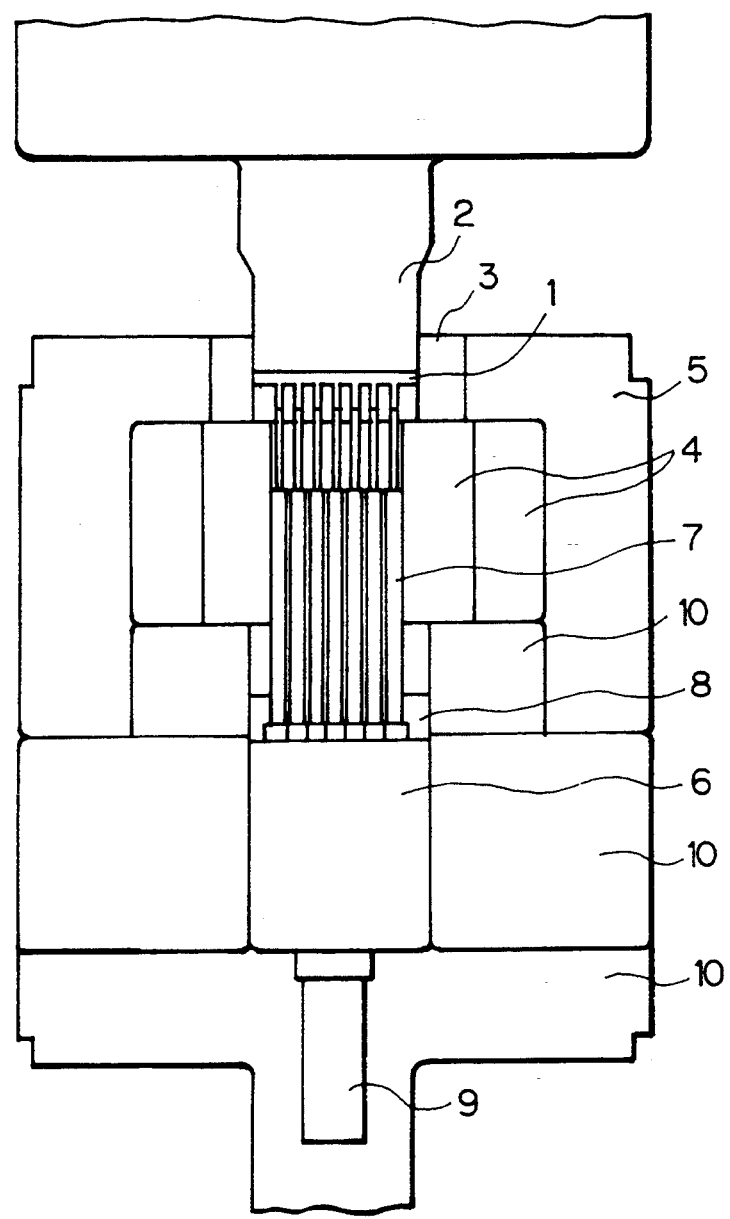
FIG. 2 is a sketch showing how cold forging is performed in the present invention.

FIG. 2 is a sketch showing how cold forging is performed to produce the pin-finned heat sink of the present invention. Shown by 1 in the drawing is the heat sink with molded pin fins, 2 is a punch, 3 is a molding die, 4 is a backing die that is provided for implementing the present invention, 5 is an outer case, 6 is a liner, 7 is a knockout pin, 8 is a knockout pin support guide that is also provided for the purpose of implementing the present invention, 9 is a cushion cylinder, and 10 is a spacer.

The molding operation itself may be performed in a conventional manner. Namely, the material to be molded is placed on the molding die 3 and forged into a desired shape by means of the punch 2. In order to prevent the choking of holes in the die and the formation of pins of uneven height during cold forging, the bearing portion of the molding die 3 is worked to have a surface roughness of not more than 0.05 μm and a "relief" is provided in the exit portion of the die so that the friction between the inner surface of the die and the material for the pin will be reduced to near zero.

The breaking of knockout pins is in many cases ascribable to the same cause as are stuffed holes in the die or unevenly high pins. Hence, it is very important to lap the bearing portion of the molding die and provide a relief in the exit portion of the die in an appropriate manner.

The molding die 3 (and preferably the backing dies 4 as well) is made of two or even three walls by shrink fitting, and a compressive prestress is imparted to the die in the circumferential and radial directions so as to prevent the cracking of the die. The backing dies 4 are provided for the purpose of preventing the flexural deformation and cracking of the molding die 3. The support guide 8 is necessary as a means for preventing the breaking of the knockout pins.

By adopting the provisions just described above, it has become possible to effect cold forging on an industrial scale under extremely severe conditions that satisfy the relationship $1.5 \leq \eta \leq 7.5$. However, even if all of those provisions are adopted, it is almost impossible to perform cold forging under conditions that satisfy the relationship $\eta > 7.5$ in industrial practice. Furthermore, as already pointed out, a marked pressure drop occurred in the experiment conducted in a wind tunnel with $\eta$ adjusted to be greater than 7.5, and this causes unwanted deterioration in the heat dissipating characteristics of the heat sink, especially when the output of a cooling fan is small.

It should be remembered that the smaller the pin diameter (d), the more likely are the holes in the die to be stuffed and the greater the tendency of the pin height (h) to become uneven. Therefore, if it is desired to render the pin diameter (d) very small, pins of a slightly larger diameter (d') can first be made by the procedure of cold forging described in the foregoing paragraphs. The surface of the pins is then etched with an alkali solution such as aqueous caustic soda so that the desired pin diameter (d) and pin-to-pin distance (c) can be attained. The heat sink produced in this way will be referred to as a "forge-etched heat sink". When producing a forge-etched heat sink, $\eta'$ of the as-forged pin fins and $\eta$ of the as-alkali etched pin fins must both lie within the range from 1.5 (inclusive) to 7.5 (inclusive). In this case, the value of $\eta$ must lie in that range after alkali etching. It should be noted that the changes that will possibly occur in the height of pins as they are etched with alkali are almost negligible.

The following examples are provided for the purpose of further illustrating the present invention but are in no way to be taken as limiting.

EXAMPLE 1

An aluminum plate (40×40×5 mm) was cold forged with a die of the design shown in FIG. 2, thereby producing a pin-finned heat sink in which 100 (10×10) pins (2.5 mm diameter×20 mm height) were arranged in a rectangular pattern. Adjacent pins were spaced apart by 1.5 mm.

Cold forging could be accomplished in a consistent manner without the choking of any holes in the die or the breaking of knockout pins. There were no defective pins of uneven height. For the heat sink under consideration, $\eta$ was 3.13.

Subsequently, the underside of the heat sink was machined until the thickness of the bottom wall was 1 mm. The thus worked heat sink was subjected to an experiment in a wind tunnel for examining its heat dissipating characteristics. The thermal resistance of the heat sink varied within the range from 3° to 2° C./W when heat was generated at 5–10 W and the air velocity was 1–2 m/sec.

Figure 3:
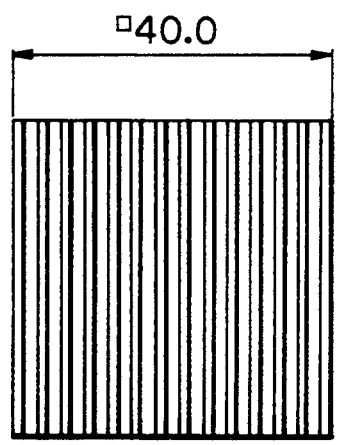
FIGS. 3(a) and 3(b) are a plan and a side view, respectively, of channel fins on one of the two comparative samples of heat sinks that were fabricated in Example 1.
Figure 3:
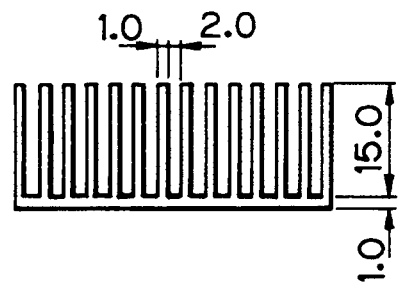
Figure 4:
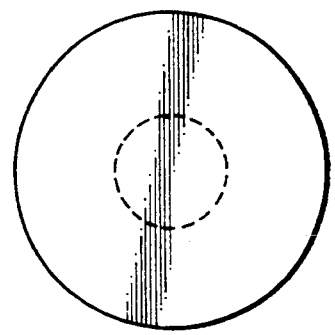
FIGS. 4(a) and 4(b) are a plan and a side view, respectively, of tower fins of the other of the two comparative samples of heat sinks that were fabricated in Example 1.
Figure 4:
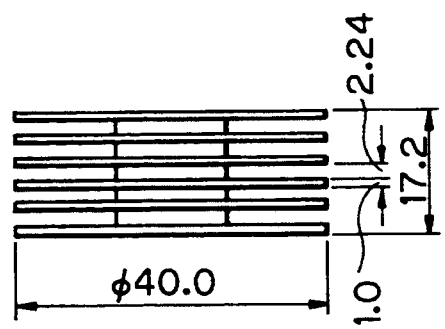

Two comparative samples of heat sinks were fabricated. One of them was a channel-finned heat sink (40×40 mm, 14 fins) plan and side views of which are shown in FIGS. 3(a) and 3(b), respectively. This heat sink had a thermal resistance in the range of 5°–3° C./W. The other comparative sample was a tower finned heat sink (40 mm in diameter, 6 fins), plan and side views of which are shown in FIGS. 4(a) and 4(b), respectively. This heat sink had a thermal resistance varying in the range of 6°–4° C./W.

Figure 5:
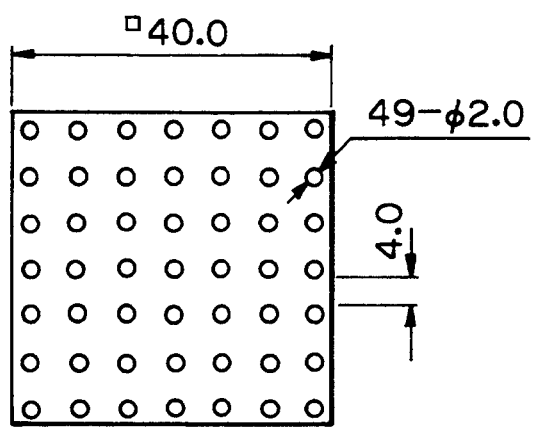
FIGS. 5(a) and 5(b) are a plan and a side view, respectively, of pin fins of the conventional sample of a heat sink that was fabricated in Example 1.
Figure 5:
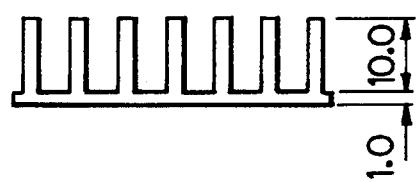

FIGS. 5(a) and 5(b) are a plan and a side view, respectively, of a conventional pin-finned heat sink. As shown, the heat sink measured 40 mm×40 mm and contained 49 (7×7) pins with the respective parameters being as follows: d=2 mm, c=4 mm, h=10 mm, and $\eta$=0.56. This heat sink had a thermal resistance varying within the range of 5.5°–3.5° C./W.

Figure 6:
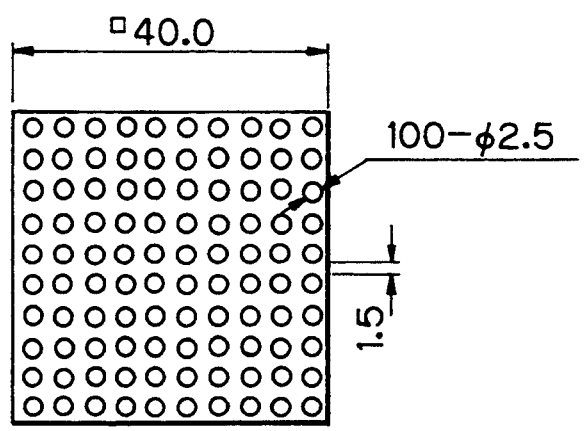
FIGS. 6(a) and 6(b) are a plan and a side view, respectively, of pin fins on the pin-finned heat sink that was fabricated Example 1 in accordance with the present invention.
Figure 6:
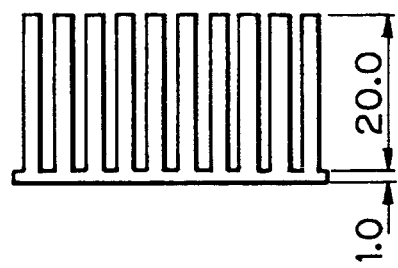

FIGS. 6(a) and 6(b) are a plan and a side view, respectively, of the pin-finned heat sink that was produced in Example 1 in accordance with the present invention. Comparing the data set forth above, it can be seen that the pin-finned type heat sink of the present invention shows remarkable heat dissipating characteristics.

The heat dissipating characteristics of a heat sink are commonly expressed in terms of the thermal resistance.

EXAMPLE 2

An aluminum alloy plate (40×40×5 mm) was cold forged with a die of the design shown in FIG. 2, thereby producing a pin-finned heat sink in which 181 [(10×10)+(9×9)] pins (2 mm in diameter ×20 mm in height) were arranged in a staggered pattern. Adjacent pins were spaced apart by 0.829 mm.

Cold forging could be accomplished in a consistent manner without the choking of any holes in the die or the breaking of knockout pins. No defective pins of uneven height were found.

Subsequently, the underside of the heat sink was machined until the thickness of the bottom wall was 1 mm. The thus worked heat sink was subjected to an experiment in a wind tunnel for examination of its heat dissipating characteristics. The thermal resistance of the heat sink varied within the range from 2.5° to 1.5° C./W when the rate of heat generation was 5–10 W and the air velocity was 1–2 m/sec. Thus, the dissipating characteristics of the heat sink under consideration far excelled those of the conventional versions. For this heat sink, $\eta$ was 5.00.

EXAMPLE 3

A square aluminum plate (40×40 mm) having a thickness of 7.5 mm was cold forged with a die of the design shown in FIG. 2, thereby producing a pin-finned heat sink of a near net shape (with the fin pins being worked to a shape very close to the desired final shape) in which 225 (15×15) pins (each 1.5 mm in diameter×30 mm in height) were arranged in a rectangular pattern. Subsequently, the heat sink was immersed in a 10% aqueous solution of caustic soda for about 17 minutes until the diameter of each pin was reduced to 1.0 mm.

The distance between adjacent pins on the cold forged product was 1.17 mm. Cold forging could be accomplished in a consistent manner without any troubles such as the cracking of the die or the breaking of knockout pins. There were no defective pins of uneven height. For the heat sink under consideration, $\eta$ was 6.31.

The distance between adjacent pins on the product just after etching with caustic soda was 1.67 mm. The underside of the heat sink was machined until the thickness of the bottom wall was 1 mm. The thus worked heat sink was subjected to an experiment in a wind tunnel for examining its heat dissipating characteristics. The thermal resistance of the heat sink varied within the range from 2.0° to 1.5° C./W with the rate of heat generation being 5–10 W and the air velocity being 1∝2 m/sec. Thus, the dissipating characteristics of the heat sink under consideration far excelled those of the conventional versions. For this heat sink, $\eta$ was 4.21.

Thus, the present invention provides a forged, especially cold-forged, pin-finned heat sink that is far better in heat dissipating characteristics than conventional channel-finned, tower-finned, or even pin-finned heat sinks. Furthermore, the pin-finned heat sink of the present invention can be produced on an industrial scale without any operational troubles such as the stuffing of holes in a molding die, unevenness in the height of pins, unsuccessful knockout operations, breaking of knockout pins, or cracking of the die. Hence, the heat sink of the present invention offers great benefits in practical applications.

The present invention also provides a novel and efficient process for producing the above-described pin-finned heat sink. The process is applicable not only to cold forging but also to warm forging, as well as to hot forging. This also contributes great benefits in practical applications.

What is claimed is:

1. A pin-finned forged heat sink comprising a plurality of forged pins, each pin being substantially round in cross-section, the heat sink having good heat dissipating characteristics and satisfying the following inequality:

$$1.5 \leq \frac{(h/d)}{\{1 + (c/d)\}^2} \leq 7.5$$

where d is the diameter of pins, c is the distance between pins, and h is the height of pins, c being equal to $\frac{1}{2}(c_1+c_2)$ wherein $c_1$ is the distance between adjacent pins in a first row of pins and $c_2$ is the distance between adjacent pins in a second row of pins which intersects the first row of pins.

2. A pin-finned forged heat sink as set forth in claim 1 wherein the inequality is:

$$2.5 \leq \frac{(h/d)}{\{1 + (c/d)\}^2} \leq 6.5.$$

3. A pin-finned forged heat sink as set forth in claim 1 wherein the inequality is:

$$3.5 \leq \frac{(h/d)}{\{1 + (c/d)\}^2} \leq 5.5.$$

4. A pin-finned forged heat sink as set forth in claim 1 wherein the heat sink is a forged-etched heat sink.

5. A pin-finned forged heat sink as set forth in claim 1 wherein pins are arranged in a rectangular pattern.

6. A pin-finned forged heat sink as set forth in claim 1 wherein pins are arranged in a staggered pattern.

* * * * *